United States Patent [19]

Yuan et al.

[11] 3,921,199

[45] Nov. 18, 1975

[54] JUNCTION BREAKDOWN VOLTAGE BY MEANS OF ION IMPLANTED COMPENSATION GUARD RING

[75] Inventors: Han-Tzong Yuan; David Willis Mueller, both of Dallas, Tex.

[73] Assignee: Texas Instruments Incorporated, Dallas, Tex.

[22] Filed: July 31, 1973

[21] Appl. No.: 384,340

[52] U.S. Cl. .................. 357/58; 148/1.5; 148/175; 148/187; 148/190; 357/13; 357/20; 357/91

[51] Int. Cl.$^2$ .......................................... H01L 29/36

[58] Field of Search .................. 357/13, 20, 58, 91; 148/1.5, 175, 187, 190

[56] References Cited

UNITED STATES PATENTS

| | | | |
|---|---|---|---|
| 3,473,093 | 10/1969 | Bilous et al. | 317/235 AD |
| 3,514,846 | 6/1970 | Lynch | 317/235 AM |
| 3,515,956 | 6/1970 | Martin et al. | 317/235 AY |
| 3,586,542 | 6/1971 | MacRae | 317/235 AY |
| 3,655,457 | 4/1972 | Duffy et al. | 317/235 AY |

*Primary Examiner*—William D. Larkins
*Attorney, Agent, or Firm*—Harold Levine; James T. Comfort; William E. Hiller

[57] ABSTRACT

The breakdown voltage of a semiconductor device with planar structure can be raised to the bulk breakdown level, if a high resistivity on lightly doped guard ring is formed around the priphery of the planar junction. This structure can be created preferably by applying ion implantation techniques to compensation dope the host semiconductor materials.

10 Claims, 3 Drawing Figures

JUNCTION BREAKDOWN VOLTAGE BY MEANS OF ION IMPLANTED COMPENSATION GUARD RING

BACKGROUND OF THE INVENTION

1. Field of the Invention

This invention relates to high power planar diodes and transistors and more specifically to increasing the breakdown voltage of such semiconductor devices.

2. Description of the Prior Art

A primary limitation in the operation and design of high power planar semiconductor devices has long been known to be that the actual breakdown voltage is normally only a fraction of the theoretical bulk breakdown voltage. Such a semiconductor device typically comprises a bulk crystal substrate and a diffused base region of opposite type from the substrate or epitaxial regions, and a diffused emitter region of the opposite type from the base region. The actual breakdown voltage value is determined by the curvature or junction depth at the periphery of the base region.

Prior art schemes to make the breakdown voltage value larger, or more on the order of the bulk breakdown voltage, have included using a mesa structure and using a guard ring. The mesa structure can realize bulk breakdown voltage but such structure defeats the reliability and other advantageous features of the planar structure. The guard ring structure used in the prior art can improve on the breakdown voltage operation a little bit, but typically can only achieve approximately 60–70 percent of the bulk breakdown voltage. However, such structure also introduces an extra base area (and an accompanying extra capacitance) and an extra processing step.

Therefore, it is a feature of this invention to provide an improved planar diode or transistor in which the actual breakdown voltage is reliably substantially the bulk breakdown voltage value and in which the host semiconductor crystal is not restricted to the silicon material.

It is another feature of the present invention to provide an improved planar structure that the guard ring around the base region does not necessarily enlarge the base area.

SUMMARY OF THE INVENTION

A preferred embodiment of the present invention provides the conventional semiconductor device with a guard ring structure composed of lightly doped p-type or n-type impurity which is made by compensating the impurity in the host material. The guard ring is preferably fabricated by means of ion implantation. The resistivity of the nearly neutralized guard ring is sufficiently high so as to prevent breakdown voltage at the edges of the base region, and to thereby increase the breakdown voltage of the planar junction to its bulk breakdown voltage value. Such a guard ring does not enlarge the base area and the ion implantation also provides a universal technique for semiconductor material other than the silicon.

BRIEF DESCRIPTION OF THE DRAWINGS

So that the manner in which the above-recited features, advantages and objects of the invention, as well as others which will become apparent, are attained and can be understood in detail, a more particular description of the invention briefly summarized above may be had by reference to the embodiment thereof which is illustrated in the appended drawings, which drawings form a part of this specification. It is to be noted, however, that the appended drawings illustrate only a typical embodiment of the invention and are therefore not to be considered limiting of its scope, for the invention may admit to other equally effective embodiments.

In the drawings.

DESCRIPTION OF PREFERRED EMBODIMENT

Figure 1:
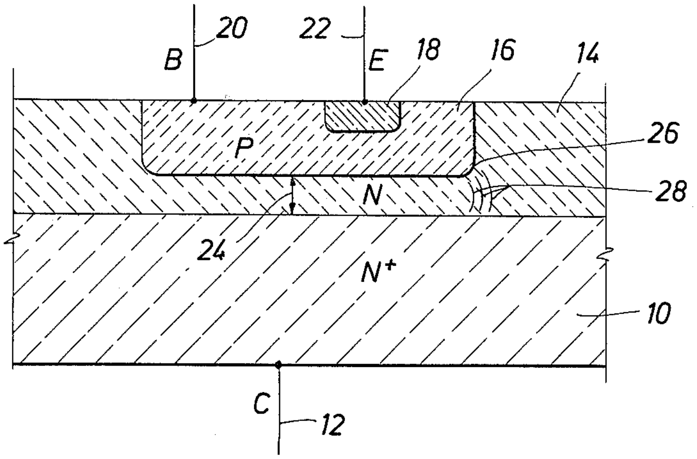
FIG. 1 PRIOR ART
FIG. 1 is a cross-sectionaal view of a silicon planar semiconductor.

High power semiconductors of the silicon planar diode, or transistor type, have as a principal operating limitation their breakdown voltage value. Ideally such planar semiconductors are designed to a certain bulk breakdown voltage value, which is the amount of voltage necessary to cause conduction between the base region and the collector substrate region through the epitaxial area overlying the collector substrate. Refer to FIG. 1 for an illustration of a typical silicon planar transistor well known in the art.

In fabricating a silicon planar transistor, a silicon substrate 10 of relatively low resistivity is selected, typically of N+ type, to which the collector connection 12 is attached. An epitaxial layer of region 14, doped to a lesser degree than substrate 10, is grown on the substrate as encouraged by vapor deposits. In the illustration, the epitaxial layer is of N type. The epitaxial layer grows in good crystalline structure and is a higher resistivity than the substrate on which it is grown.

P-type base region 16 is diffused into epitaxial region 14 and N-type emitter region 18 is diffused into base region 16. Connectors 20 and 22 provide electrical contact with base region 16 and emitter region 18, respectively.

Figure 2:
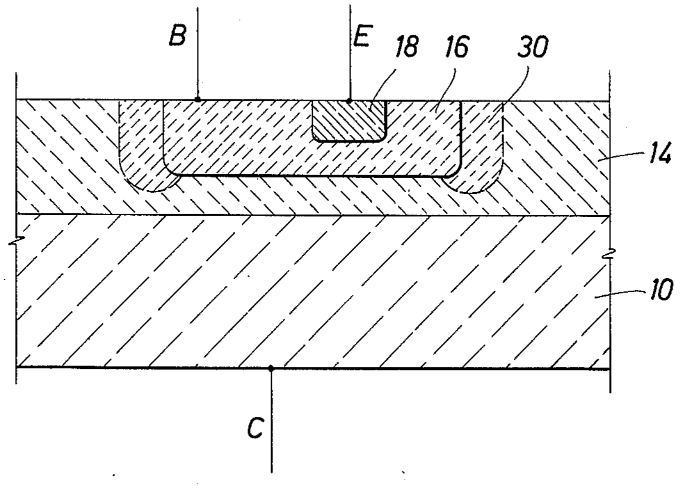
FIG. 2 is a cross-sectional view of a silicon planar semiconductor having a guard ring surrounding its base region in accordance with one prior art structure.

Theoretically the breakdown voltage value between the base region and collector substrate region 10 through the high resistivity of epitaxial region 14 is calculated from the area of the base region and distance 24 through the epitaxial region between the base and collector substrate regions. It is desirable that the base area be kept as small as possible for the working requirements, since a larger base area increases the internal capacitance of the device. It is also desirable that distance 24 be kept as short as possible, since more operating current is required as the distance becomes larger. Nevertheless, it is well known that the breakdown voltage is actually much less than the theoretical value just considering the area, distance and resistivity of the material (this theoretical value being known as the "bulk breakdown voltage" value). It is not understood that the actual breakdown voltage is determined by the curvature 26 around the edge of diffused base region 16. The field lines at this location cause the lowering of the effective resistivity in this location and hence cause breakdown to occur before the bulk breakdown voltage is reached, and hence establish low voltage paths 28. For a very shallowly diffused device, normally only one-half of the bulk breakdown voltage can be realized. With this knowledge that the low resistivity region is at curvature 26, the diffusion of a P+ guard ring 30 has been employed, such as illustrated in FIG. 2. This type of guard ring has successfully enlarged the radius of curvature 26 and therefore tends to lessen the stress lines which causes the low resistivity, as mentioned above in FIG. 1. However, the depth of the diffusion is not easy to control and therefore the absolute distance in the epitaxial region of the resistivity path may be reduced. Furthermore, the base area is enlarged with the attendant undesirable increase in capacitance. The breakdown voltage value may be higher than for the FIG. 1 structure, but is still normally only about 60–70 percent of the bulk breakdown voltage value.

Another approach at increasing the breakdown voltage value has been to etch out the epitaxial layer to form a mesa structure and then replace the etched out region with a high resistivity material. Although this technique has proven somewhat successful in increasing the breakdown voltage value, the mesa structure is not as good operationally in some applications or interchangeable with the planar structure for reasons unrelated to breakdown voltage. Therefore, for some applications, this structure is an unacceptable solution to the breakdown voltage problem.

Figure 3:
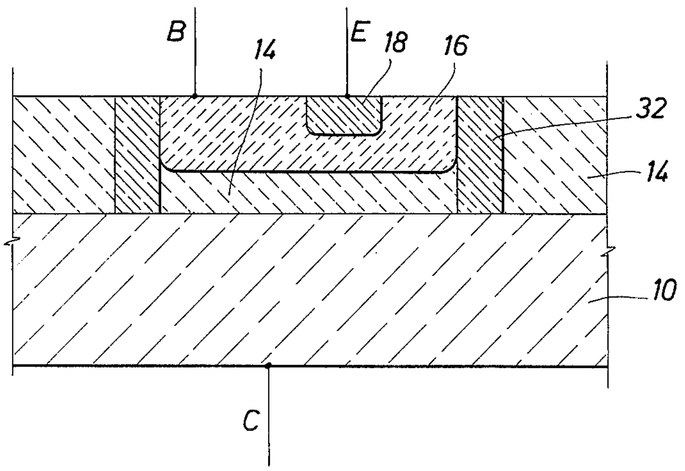
FIG. 3 is a cross-sectional view of a silicon planar semiconductor having a guard ring surrounding its base region in accordance with a preferred embodiment of the invention.

Now referring to FIG. 3, a structure is illustrated for a silicon planar semiconductor device in which the planar structure is preserved and the breakdown voltage characteristics are equal to bulk breakdown voltage. There is included in this structure, which is otherwise similar to the structure shown in FIG. 1, a guard ring 32 surrounding diffused base region 16. As illustrated, it is preferred, although not absolutely essential, that this guard ring extends completely through epitaxial layer 14 to silicon substrate 10. In order for guard ring 32 to be effective, the breakdown due to resistivity of the guard ring must be at least as great as the bulk breakdown voltage between base region 16 and substrate 10. Hence, it is greater than the resistivity of voltage paths 28.

The guard ring structure that will accomplish this greater resistivity is one in which has impurities introduced therein to compensate for the impurities naturally present in epitaxial layer 14. That is, since in the illustration, layer 14 is doped to be N type, doping toward P type is necessary to achieve the desirable neutralization or compensation. It has been discovered that it is possible to apply an adequate does of impurity of one kind to compensate for the impurity of another type. Ion implantation is useful for provide the precision of control not otherwise possible to accomplish this compensation without flip over of the majority impurity type. Hence, the resistivity in the guard ring can be modified without actually changing the characteristics of the operating regions of the device.

For example, suppose that epitaxial layer 14, 3 to 5 $\mu$m thick, comprises a one ohm-cm N type crystal with around $5 \times 10^{15}$ $cm^{-3}$ N type impurity. It is possible by ion implantation to introduce into layer 14 a 4 to $6 \times 10^{15}$ P type impurity to create guard ring 32. In this guard ring, the resistivity of the crystal increases from the initial value of one ohm-cm to five ohm-cm. Since this value is much greater than the resistivity between base region 16 and substrate 10, the actual breakdown voltage value is now the bulk breakdown voltage value.

Note that it is not necessary to completely implant guard ring 32 through epitaxial layer 14, although this is preferred. All that is absolutely required is to increase the resistivity of the epitaxial material in the vicinity of paths 28 (FIG. 1) above the resistivity of the path between base region 16 and substrate 10.

Also, the fabrication of guard ring 32 in the above-described manner infuses the compensating impurity without establishing concentration gradients. Moreover, if there is no flip over, then the area of base region 16 is maintained the same size and hence there is no increase of undesirable capacitance as with the FIG. 2 guard ring structure.

It has been stated that guard ring 32 is preferably created by using ion implantation techniques. In very shallowly diffused situations (for doping less than about 5000 A), it is possible to create guard ring 32 by diffusion or by epitaxial refill techniques. Both are harder than ion implantation to control, do not have the precision and are more tedious, however.

While a particular embodiment of the invention has been shown, it will be understood that the invention is not limited thereto, since many modifications may be made and will become apparent to those skilled in the art.

What is claimed is:

1. Method of fabricating a planar semiconductor device for achieving actual breakdown voltage characteristics substantially equal to bulk breakdown voltage, comprising:

overlying a host crystal substrate with an epitaxial layer of the same type majority carriers as said host crystal substrate;

diffusing into said epitaxial layer to a depth less than the thickness thereof a region of opposite type majority carriers from said epitaxial layer; and introducing a guard ring into said epitaxial layer surrounding said region of opposite type majority carriers to a depth at least below the diffusion depth of said region of opposite type majority carriers and so constituted as to provide a zone of substantial neutrality in majority carriers at least in the area immediately adjacent the lowermost portion of said region of opposite type majority carriers, said guard ring effectively establishing a higher resistivity path from the lower peripheral edge of said region of opposite type majority carriers to said host crystal substrate than the resistivity path directly between an intermediate portion of said region of opposite type majority carriers and said host crystal substrate.

2. Method as set forth in claim 1, wherein said guard ring is introduced by ion implantation to dope said guard ring with a dose of impurity of a kind to substantially compensate for the kind of impurity existing in said epitaxial layer.

3. Method as set forth in claim 2, wherein said guard ring is ion implanted completely through the thickness of said epitaxial layer into contact with said host crystal substrate.

4. Method as set forth in claim 1, wherein said host crystal substrate is of N+ type silicon, said epitaxial layer is of N type silicon and said diffused region is of P type silicon.

5. Method as set forth in claim 1, wherein the overlying of the host crystal substrate with said epitaxial layer is accomplished under gas-phase conditions to form said epitaxial layer with a reduced concentration of the same type majority carriers as compared to the concentration of said majority carriers in said host crystal substrate.

6. A planar semiconductor device having an actual breakdown voltage characteristic substantially equal to bulk breakdown voltage, comprising:

a host crystal substrate having an epitaxial layer thereover of the same type majority carriers as said host crystal substrate;

a diffused region in said epitaxial layer of opposite type majority carriers from said epitaxial layer, said diffused region having a depth less than the thickness of said epitaxial layer so as to define a space between said diffused region and said host crystal substrate; and a guard ring provided in said epitaxial layer and extending from the upper surface thereof in surrounding relation to said diffused region to a depth at least below said diffused region, said guard ring including at least a zone of substantially neutrality in majority carriers in the area immediately adjacent the lowermost portion of said diffused region so as to establish a higher resistivity path from the lower peripheral edge of said diffused region to said host crystal substrate than the resistivity path in said epitaxial layer between an intermediate portion of said diffused region and said host crystal substrate.

7. A planar semiconductor device as set forth in claim 6, wherein said guard ring is ion implanted.

8. A planar semiconductor device as set forth in claim 6, wherein said host crystal substrate is of N+ type silicon, said epitaxial layer is of N type silicon and said diffused region is of P type silicon.

9. A planar semiconductor device as set forth in claim 6, wherein said guard ring extends completely through the thickness of said epitaxial layer into contact with said host crystal substrate.

10. A planar semiconductor device as set forth in claim 6, wherein said epitaxial layer has a reduced concentration of the same type majority carriers as compared to the concentration of said majority carriers in said host crystal substrate.

* * * * *